United States Patent [19]
Maruo

[11] Patent Number: 5,181,090
[45] Date of Patent: Jan. 19, 1993

[54] HIGH VOLTAGE CMOS DEVICES

[75] Inventor: Yutaka Maruo, Nagano, Japan

[73] Assignee: Seiko Epson Corporation, Tokyo, Japan

[21] Appl. No.: 356,202

[22] Filed: May 24, 1989

[30] Foreign Application Priority Data

May 25, 1988 [JP] Japan ................. 63-125634

[51] Int. Cl.$^5$ .............................................. H01L 27/92
[52] U.S. Cl. ........................... 257/344; 257/389; 257/900; 257/409; 257/408
[58] Field of Search ............ 357/23.5, 23.1, 23.6, 357/23.8, 23.3, 42

[56] References Cited

U.S. PATENT DOCUMENTS

| | | | |
|---|---|---|---|
| 4,037,242 | 7/1977 | Gosney | 357/23.5 |
| 4,521,448 | 6/1985 | Sasaki | 357/23.5 |
| 4,652,897 | 3/1987 | Okuyama et al. | 357/23.5 |
| 4,663,645 | 5/1987 | Komori et al. | 357/23.3 |
| 4,745,086 | 5/1988 | Parrillo et al. | 357/42 |
| 4,784,966 | 11/1988 | Chen | 357/42 |
| 4,788,663 | 11/1988 | Tanaka et al. | 365/185 |
| 4,804,637 | 2/1989 | Smayling et al. | 357/23.5 |
| 4,845,544 | 7/1989 | Shimizu | 357/45 |
| 4,851,361 | 6/1989 | Schumann et al. | 357/23.5 |

OTHER PUBLICATIONS

Ogura et al., "Design and Characteristics of the Lightly Doped Drain-Source (LDD) Insulated Gate Field Effect Transistor", IEEE Trans. on Dev., pp. 1359-1367, Aug. 1980.

*Primary Examiner*—William D. Larkins
*Attorney, Agent, or Firm*—Spensley Horn Jubas & Lubitz

[57] ABSTRACT

A semiconductor memory and method of manufacture which are particularly useful for a high breakdown voltage EEPROM wherein high breakdown voltage transistors which are employed in a relatively large number and therefore greatly affect the integration density are formed with the masked offset structure, which is advantageous from the viewpoint of the integration density, while high breakdown voltage transistors which are not required in a large number and therefore have no large effect on the integration density are formed with the LOCOS offset structure, which requires a relatively small number of manufacturing steps and hence involves a relatively low production cost, and these two different types of transistors are fabricated on the same substrate. This arrangement enables optimization of the device structure in regard to miniaturization, reduction in the number or masks required and simplification of the manufacturing process.

9 Claims, 6 Drawing Sheets

HIGH VOLTAGE CMOS DEVICES

BACKGROUND OF THE INVENTION

1. Field of the Invention

The present invention relates to a semiconductor device and, more particularly, to a high breakdown voltage semiconductor device. The present invention further pertains to a semiconductor device which is usefully employed in a high breakdown voltage EEPROM (Electrically Erasable and Programmable Read-Only Memory) which is under development as a nonvolatile memory of the next generation and which is expected to supplant conventional semiconductor memories such as the PROM (Programmable Read-Only Memory) and EPROM (Erasable and Programmable Read-Only Memory). The present invention is also concerned with a method of manufacturing such a high breakdown voltage semiconductor device.

2. Description of the Related Art

In an EPROM or EEPROM that has a peripheral circuit constituted by a CMOS (Complementary Metal-Oxide Semiconductor) circuit, n-channel MOS (Metal-Oxide Semiconductor) transistors are generally employed to form memory cells. In this case, each memory cell of the EPROM in which data is not electrically erasable is constituted by a single memory transistor, whereas each memory cell of a high breakdown voltage EEPROM in which data is electrically erasable is formed from a combination of a memory transistor and a select transistor (also known as "word transistor") which are coupled together and both of which must generally be n-channel high breakdown voltage transistors.

On the other hand, p-channel MOS type high breakdown voltage transistors in the CMOS peripheral circuit are used only for a voltage changing circuit or the like and therefore the number of p-channel high breakdown voltage transistors required is smaller than the number of n-channel high breakdown voltage transistors used for memory cells.

In particular, in the case of the EEPROM, each memory cell is constituted by a combination of a FAMOS type n-channel transistor used as a memory transistor and a MOS type n-channel MOS transistor used as a select transistor, these two transistors being coupled together at an n-type diffused region which is mutually used as the drain of the memory transistor and the source of the select transistor. The FAMOS type n-channel transistor is formed with a multilayer gate structure wherein a control gate is provided beside a floating gate in which data is written.

The following publications are representative of the above-described prior art that is related to the present invention:

Publication 1: Japanese patent publication No. 58-6237 (1983)

Publication 2: Japanese patent Laid-Open (Kokai) publication No. 59-151469 (1984)

Publication 3: Japanese patent Laid-Open (Kokai) publication No. 61-154078 (1986)

Among the above-mentioned publications, Publication 1 discloses a memory cell for an electrically erasable and programmable nonvolatile semiconductor device, the memory cell being formed using a FAMOS type transistor having a double-layer gate structure. Publication 2 discloses a novel structure for a protective circuit element which is very conformable to a high breakdown voltage MOS type field effect transistor which is defined by a transistor having offset regions provided under either a thick insulating film formed on a substrate or a thick insulating film formed on a part of the surface of a substrate by subjecting it to local oxidation, the offset regions having a lower impurity concentration than the portions of source and drain regions which are in contact with interconnections for leading out the source and drain regions (such a transistor being hereinafter referred to as "LOCOS (Local Oxidation of Silicon) offset type transistor"). Publication 3 discloses a high breakdown voltage MOS type field effect transistor which is defined by a transistor having source and drain regions formed so that each region comprises two regions having different impurity concentrations as in the case of the so-called LDD (Lightly Doped Drain) structure by use of either a resist pattern formed utilizing a mask or a sidewall insulating film formed on each side wall of a gate electrode and that region in each of the source and drain regions which is closer to the channel region and which has a relatively low impurity concentration is defined as an offset region (such a transistor being hereinafter referred to as "masked offset type transistor").

In conventional semiconductor devices of the type described above, that is semiconductor memories having nonvolatile memory cells, two different types of transistor, i.e., p- and n-channel masked offset type transistors and p- and n-channel LOCOS offset type transistors, are produced separately from each other. Accordingly, in a conventional semiconductor device of the type described above, all the p- and n-channel transistors are either masked offset type transistors or LOCOS offset type transistors.

The respective features of the above-mentioned two different types of transistor will next be explained.

The masked offset type transistor occupies a relatively small area and therefore contributes to miniaturization (i.e., achievement of high integration), but on the other hand, it has the disadvantage that a mask or a special process is needed to form the offset regions, that is, it is necessary to carry out a process for forming offset regions which are defined by diffused regions having a relatively low concentration (e.g., p$^-$ or n$^-$).

In contrast, the LOCOS offset type transistor, which needs to have a thick oxide film above each offset region, requires a relatively large area and is therefore disadvantageous to miniaturization, but it has the advantage that there is no need for a special-purpose mask to form offset regions defined by low concentration (e.g., p$^-$p$^-$ or n$^-$) diffused regions and hence the number of required manufacturing steps is smaller than in the case of the masked offset structure.

Accordingly, there is a need for a device structure wherein, in the case where both n- and p-channel transistors are required to have a high breakdown voltage, either of the two types of transistor, that is, n- and p-channel transistors, which is needed in a relatively large number is formed utilizing the masked offset structure, while the other type of transistor, which is not needed in a large number, is formed utilizing the LOCOS offset structure, with the above-described advantages and disadvantages of the two different types of offset structure taken into consideration, and these two types of transistors are appropriately disposed on the same substrate. Development of a method of manufacturing such a device structure is also needed.

SUMMARY OF THE INVENTION

In view of the above-described problems of the prior art, it is a primary object of the present invention to provide a semiconductor device for a CMOS type semiconductor memory which is most suitable from the viewpoint of miniaturization and simplification of the manufacturing process, for example yielding a reduction in the number of masks needed, and also to provide a method of manufacturing such a semiconductor device.

To this end, the present invention provides a semiconductor device wherein a memory cell region and a peripheral circuit region are formed on the same semiconductor substrate. The memory cell region is comprised of memory transistors and select transistors, which are, for example, n-channel high breakdown voltage transistors defined by a relatively large number of masked offset type MOS transistors, and the peripheral circuit region being comprised of a relatively small number of, for example, p-channel high breakdown voltage transistors which are defined by LOCOS offset type MOS transistors and, for example, n-channel high breakdown voltage transistors which are defined by masked offset type MOS transistors.

In one example of the method of manufacturing a semiconductor device according to the present invention, after an n-well has been formed in a LOCOS offset type transistor forming region of a p-type semiconductor substrate, a p-type channel stopper region is formed around a masked offset type transistor forming region which is in a region exclusive of the n-well and also in a region which is under each edge of a region for forming a gate of a LOCOS offset transistor, and an n-type channel stopper region is formed within, and adjacent, the periphery of the n-well and in contact with the p-type channel stopper region, and then the surfaces of the p- and n-type channel stopper regions are subjected to local oxidation to for a LOCOS oxide film, thereby simultaneously forming isolation regions defined by a combination of the LOCOS oxide film and the p- and n-type channel stopper regions and p-type LOCOS offset regions. Further, gate electrodes which are made of the same polycrystalline silicon are respectively formed in the LOCOS offset type transistor forming region and the masked offset type transistor forming region, and after n-type low concentration diffused layers have been formed with the gate electrode in the masked offset type transistor forming region used as a mask, an n-type impurity is introduced with a resist covering the gate electrode used as a mask to form source and drain regions defined by high concentration diffused layers, thereby forming a masked offset type transistor having an LDD structure. Then, with the gate electrode in the LOCOS offset type transistor forming region used as a mask, a p-type impurity is introduced into the LOCOS offset type transistor forming region to form source and drain regions defined by high concentration diffused layers, thereby forming a p-channel LOCOS offset type transistor. In this process, the above-described conductivity types, p and n, may be interchanged with each other. The term "MOS" is intended to encompass MIS in the present invention.

Thus, according to the present invention, high breakdown voltage transistors that constitute a semiconductor memory such as an EEPROM are formed utilizing two different types of offset structure, that is, the masked offset structure and the LOCOS offset structure, such that the two different types of offset transistors are formed on the same substrate. More specifically, either one of the two types of transistors, that is, n- or p-channel transistor types, which is required in a relatively large number is formed utilizing the masked offset structure that is advantageous to miniaturization although the number of manufacturing steps increases a little, while the other type of transistor which is used, for example, for a part of a peripheral circuit but is not required in a large number, is formed utilizing the LOCOS offset structure that is unsuitable for miniaturization but causes no increase in the number of manufacturing steps. Therefore, optimization is achieved with respect to both the quality and quantity of these high breakdown voltage transistors. Thus, it is possible to form memory circuit elements at the same time without waste.

BRIEF DESCRIPTION OF THE DRAWINGS

The above and other objects, features and advantages of the present invention will become more apparent from the following description of the preferred embodiments thereof, taken in conjunction with the accompanying drawings, in which like reference numerals denote like elements and, of which.

DESCRIPTION OF THE PREFERRED EMBODIMENTS

The present invention will be described herebelow in detail with reference to the accompanying drawings.

EMBODIMENT 1

Figure 1:
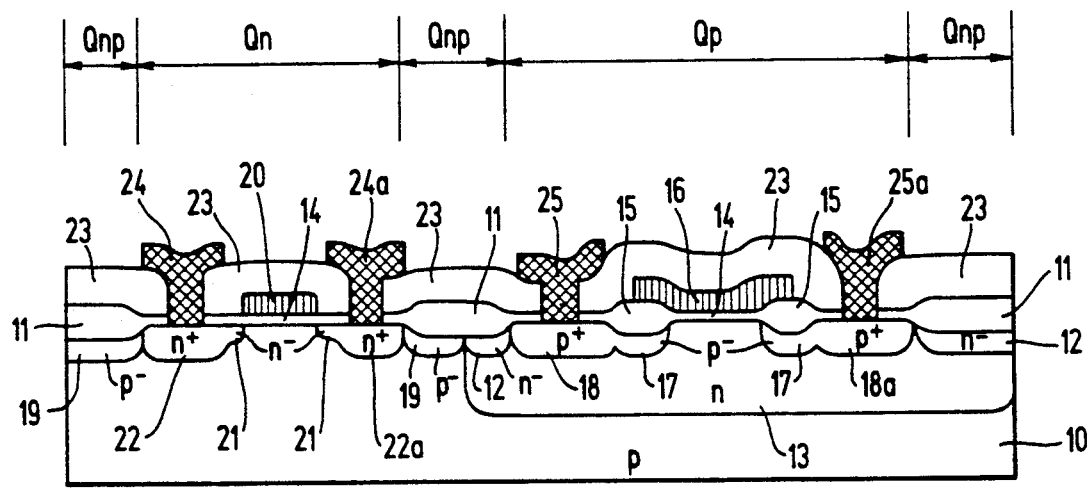
FIG. 1 is a fragmentary sectional view showing the arrangement of high breakdown voltage CMOS transistors according to one embodiment of the present invention.

FIG. 1 is a fragmentary sectional view showing the arrangement of high breakdown voltage CMOS transistors according to one embodiment of the present invention. The illustrated high breakdown voltage CMOS comprises an n-channel masked offset type MOS transistor Qn (hereinafter referred to as "Qn") and a p-channel LOCOS offset type MOS transistor Qp (hereinafter referred to as "Qp"). The reference symbol Qnp denotes isolation regions formed by LOCOS.

Qp is formed in an n-well region 13, of the second conductivity type, which is surrounded by an isolation region which is comprised of a LOCOS oxide film 11 serving as a field oxide film which is locally formed on a p-type semiconductor substrate 10, of the first conductivity type, and an $n^-$-type channel stopper region 12 formed under the LOCOS oxide film 11. The reference numeral 14 denotes a gate oxide film around which are formed LOCOS oxide films 15 with a relatively small area. A gate electrode 16 which is formed from a polycrystalline silicon layer is formed so as to extend over the gate oxide film 14 and part of the LOCOS oxide films 15. The reference numeral 17 denotes $p^-$-type offset regions provided under the LOCOS oxide films 15, and 18 and 18a are $p^+$-type diffused layers serving as source/drain regions. With this arrangement, Qp having the LOCOS offset structure is formed.

On the other hand, Qn is formed in a region surrounded by an element isolation region composed of a LOCOS oxide film 11 and a $p^-$-type channel stopper region 19 provided under the LOCOS oxide film 11. More specifically, a gate electrode 20 is formed on a gate oxide film 14, and $n^+$-type diffused layers 22 and 22a which serve as source/drain regions are provided below the gate oxide film 14 so as to be in connection with respective $n^-$-type offset regions 21, thus forming Qn having a masked offset structure on the same substrate as that of Qp.

The reference numeral 23 denotes an interlayer insulating film which is defined by an oxide film or PSG (including BPSG) film. The reference numerals 24 and 24a denote Al interconnection films for leading out the source/drain regions of Qn, while the numerals 25 and 25a denote Al interconnection films for leading out the source/drain regions of Qp.

Since the operation of the high breakdown voltage CMOS comprising Qp and Qn according to the present invention is the same as that of the prior art, description thereof is omitted.

EMBODIMENT 2

Figure 2A:
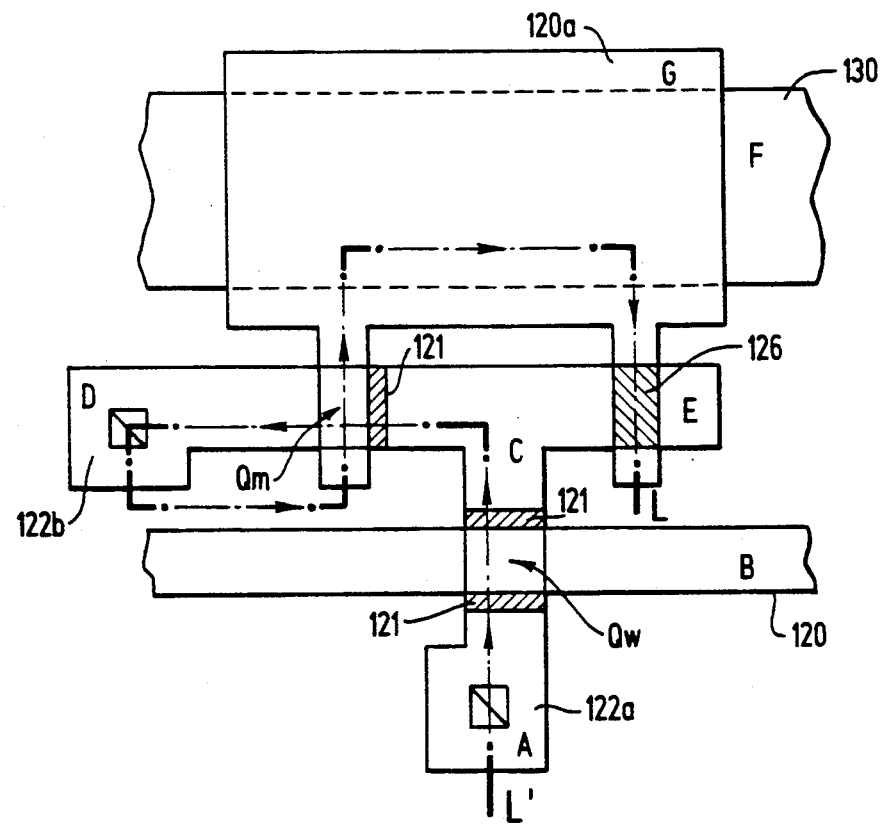
FIG. 2(a) is a plan view of another embodiment of the present invention, which shows a memory cell region of an EEPROM that employs high breakdown voltage n-channel transistors.
Figure 2B:
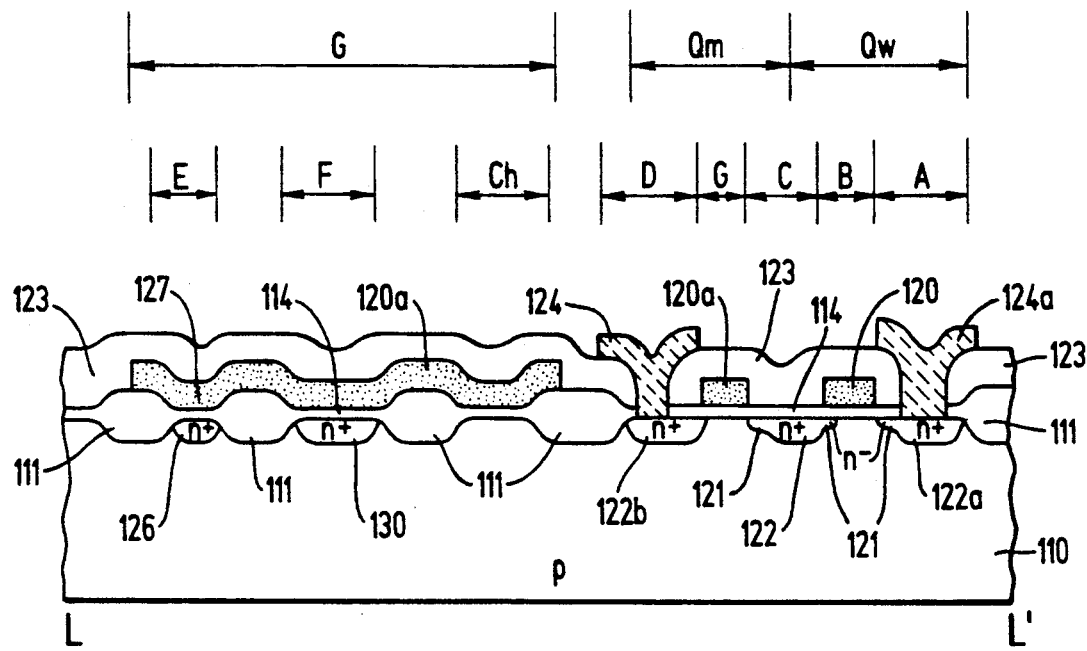
FIG. 2(b) is a sectional view taken along the line L—L' of FIG. 2(a)
Figure 2C:
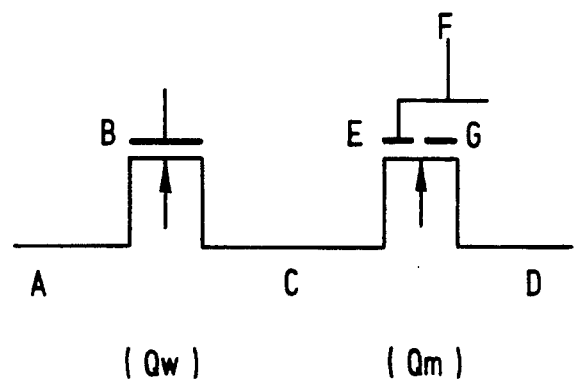
FIG. 2(c) is a diagram showing an equivalent circuit of the arrangement shown in FIG. 2(a)

FIG. 2(a) is a plan view of another embodiment of the present invention, which shows a memory cell region of an EEPROM that employs high breakdown voltage n-channel transistors. The illustration memory cell comprises a memory transistor and a select transistor. FIG. 2(b) is a sectional view taken along the line L—L' of FIG. 2(a), and FIG. 2(c) is a diagram showing an equivalent circuit of the arrangement shown in FIG. 2(a).

Thus, a principal feature of this embodiment resides in a high breakdown voltage EEPROM which employs n-channel transistors to form memory cells and a combination of p- and n-channel transistors to form a peripheral circuit, wherein n-channel transistors that are employed in a relatively large number to form mainly memory cells are formed utilizing the masked offset structure, while p-channel transistors that are employed in a relatively small number are formed utilizing the LOCOS offset structure. The following is a description of one example in which masked offset type n-channel transistors are employed to form memory cells.

In the equivalent circuit shown in FIG. 2(c), the portion which is comprised of a drain A, a gate B and a source/drain C is an n-channel select transistor (hereinafter referred to as "Qw"), while the portion which is comprised of the source/drain C, a source D, a floating gate G, a control gate F and a source/drain field region E is a memory transistor (hereinafter referred to as "Qm") having the FAMOS structure. The two transistors Qw and Qm are coupled together through the common source/drain C, as illustrated. In FIGS. 2(a), 2(b) and 2(c), the reference numerals A to G, Qw and Qm denote the same elements. Another feature of this embodiment resides in that memory cells have a memory structure for a high breakdown voltage EEPROM of the type which has a single layer of polycrystalline silicon, as described later.

The arrangement of transistors that constitute the illustrated memory cell structure will be explained below with specific reference to the sectional view of FIG. 2(b).

The reference numeral 111 denotes LOCOS oxide films serving as a field oxide film which is formed on a p-type semiconductor substrate 110, the LOCOS oxide films 111 defining element isolation regions. P-type channel stopper regions (not shown) are formed under the LOCOS oxide films 111.

Qw is an n-channel masked offset type high breakdown voltage transistor which comprises a drain (A) 122a defined by an $n^+$-type diffused layer, a gate electrode (B) 120 defined by a polycrystalline silicon layer, and a source (C) 122 defined by an $n^+$-type diffused layer and which has a masked offset structure formed by $n^-$-type offset regions 121 and source/drain regions 122 and 122a. Qw is generally called a "select transistor" or "word transistor" from the functional point of view.

Qm, which adjoins Qw, is a single-side masked offset type n-channel high breakdown voltage transistor which comprises a source 122b defined by an $n^+$-type diffused layer, a drain defined by region 122, an $n^-$-type offset region 121 and a gate electrode 120a defined by a polycrystalline silicon layer. The transistor Qm has the FAMOS structure and serves as a memory transistor which includes a floating gate portion G explained below.

Referring to FIG. 2(c) in conjunction with FIG. 2(b), the reference symbol G denotes a floating gate portion, in which Ch denotes a channel region, F, a control gate defined by an $n^+$-type diffused layer 130, and E, a tunnel region defined by an $n^+$-type diffused layer 126. In contrast to a typical conventional EEPROM wherein a gate electrode is formed from two layers of polycrystalline silicon, a floating gate and a control gate provided over the floating gate, the illustrated structure is formed using a single layer of polycrystalline silicon and has a control gate defined by an $n^+$-type diffused layer 130 formed in the substrate 110. It should be noted that the reference numeral 123 denotes an interlayer insulating film, while 124 and 124a, respectively, denote Al interconnection layers for leading out the source/drain regions 122b and 122a, the layers 124 and 124a being formed through openings provided in the interlayer insulating film 123.

In this way, masked offset type transistors are employed as n-channel transistors which are required in a relatively large number to form memory cells, while LOCOS offset type transistors such as Qp shown in FIG. 1 are employed as p-channel transistors which are required in a relatively small number to constitute a part of a peripheral circuit, thereby achieving miniaturization and simplification of the manufacturing process and thus providing an optimized EEPROM.

The following is a description of a basic mechanism of a memory cell of the type having a single layer of a polycrystalline silicon, which is one feature of the arrangement of this embodiment.

To write or erase data, a voltage of from about 15 V to 20 V is applied between the tunnel region 126 and the control gate 130 to thereby apply a field of about 10 MV/cm or more to a thin tunnel oxide film 127 (thickness: 100Å) between the floating gate 120a and the tunnel region 126. In consequence, electrons are injected into or released from the floating gate 120a through the tunnel oxide film 127 by the well-known phenomenon, that is Fowler-Nordheim tunneling. Thus, when electrons are injected, data is electrically erased, whereas, when electrons are released, data is electrically written.

More specifically, when electrons are injected into the floating gate 120a, the threshold voltage of the memory transistor Qm is raised, whereas, when electrons are released therefrom, the threshold voltage is lowered. Accordingly, when a voltage which is intermediate between threshold voltages which are respectively set as a result of injection and release of electrons is applied to the control gate 130, if electrons have been injected into the floating gate 120a, the memory transistor Qm is OFF, whereas, if electrons have been released therefrom, the transistor Qm is ON, thus enabling discrimination between the ON and OFF states of the memory transistor Qm. It is therefore possible to achieve an EEPROM which is similar to a conventional FLOTOX (Floating gate Tunnel Oxide) that has a double-layer gate structure.

The single-layer gate structure according to this embodiment has the advantage that the slope of the steps is minimized by a reduction in the number of layers of polycrystalline silicon and therefore step coverage is improved, so that the incidence of electromigration and other similar problems becomes low. Thus, the single-layer gate structure is considerably effective to increase the integration density, improve the device performance and raise the production yield.

EMBODIMENT 3

FIGS. 3(a) to 3(k) are sectional views showing successive steps of a method of manufacturing high breakdown voltage CMOS transistors, similar to those shown in FIG. 1, according to still another embodiment of the present invention. The manufacturing method according to the present invention will next be explained sequentially with reference to FIGS. 3(a) to 3(k). It should be noted that in these figures the elements or portions which are identical or equivalent to those shown in FIG. 1 are denoted by the same reference numerals for the sake of convenience.

Figure 3A:
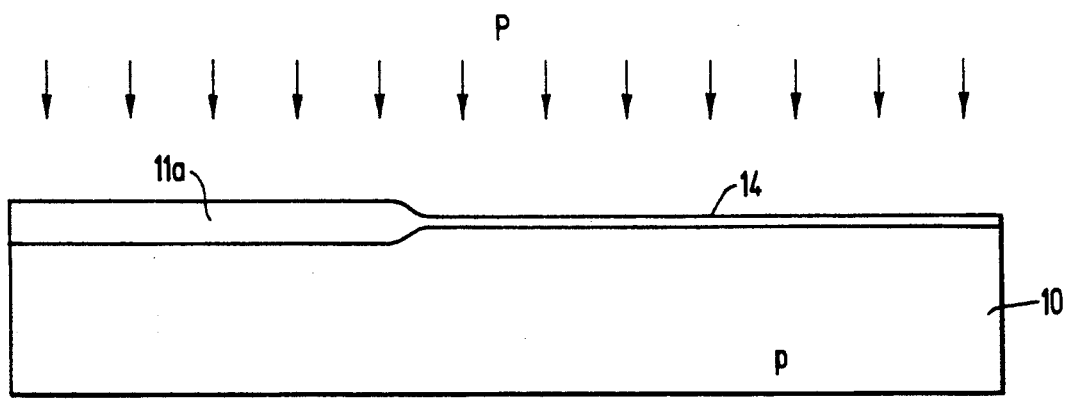
FIGS. 3(a) to 3(k) are sectional views sequentially showing the steps of a method of manufacturing high breakdown voltage CMOS transistors, similar to those shown in FIG. 1, according to still another embodiment of the present invention.

(a) Referring first to FIG. 3(a), the surface of a p-type silicon substrate 10, except for an n-well forming region, is subjected to wet oxidation at 1000° C. by use of a local oxidation technique to form a silicon oxide film 11a having a thickness of about 5000Å, and the n-well forming region is subjected to dry oxidation at 1000° C. to form a silicon oxide film 14 having a thickness of about 400Å. Thereafter, ion implantation of P (phosphorus) is effected through the silicon oxide film 14 under the conditions of 120 keV and a concentration of $5 \times 10^{12} cm^{-2}$, and then a treatment is carried out for 13 hours in an $N_2$ (nitrogen) atmosphere containing 10% of $O_2$ (oxygen) at 1160° C., thereby activating P driven into the n-well forming region and thus forming an n-well 13, as shown in FIG. 3(b).

Figure 3B:
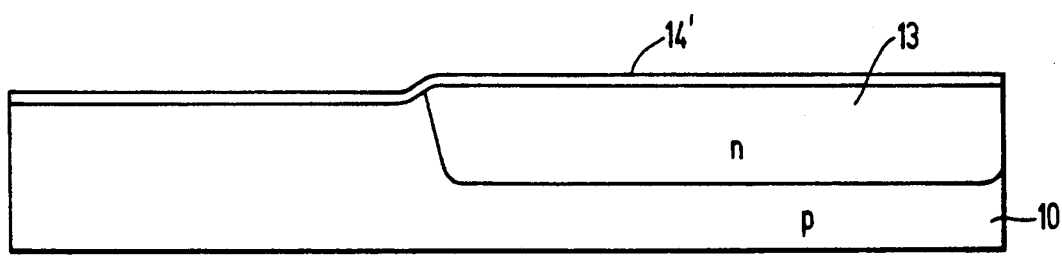

(b) Thereafter, the silicon oxide films 11a and 14 are removed, and then the surface of the substrate 10 is subjected to dry oxidation at 1000° C. again to form another silicon oxide film 14' having a thickness of about 400Å, as shown in FIG. 3(b).

Figure 3C:
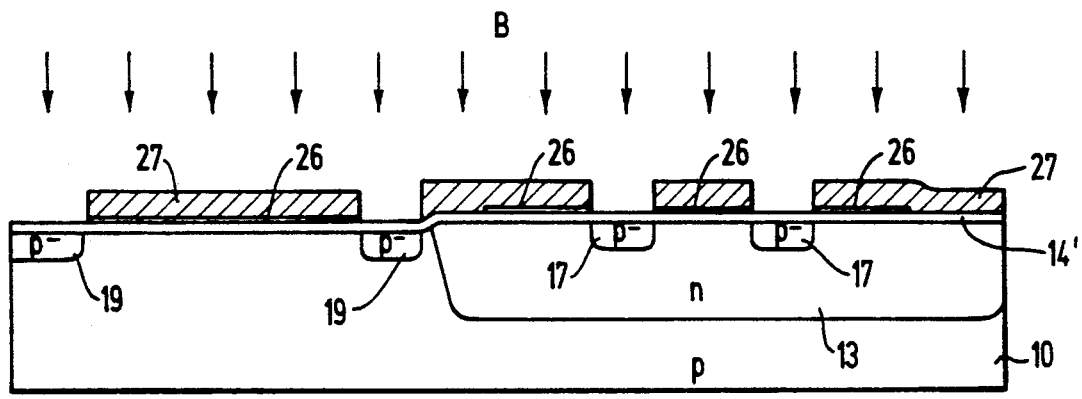

(c) As shown in FIG. 3(c), a silicon nitride film is first deposited on the whole surface and portions thereof are removed by photoetching to leave silicon nitride sections 26 only in element forming regions. Then, the resist 27 is coated on the whole surface and subjected to photoetching to provide openings therein at regions where p-type stoppers are to be formed. Thereafter, ion implantation of B (boron) is effected under the conditions of 35 keV and a concentration of $3 \times 10^{14} cm^{-2}$ and, after the resist 27 has been removed, a heat treatment is carried out to form p⁻-type offset regions 17 and p⁻-channel stopper regions 19.

Figure 3D:
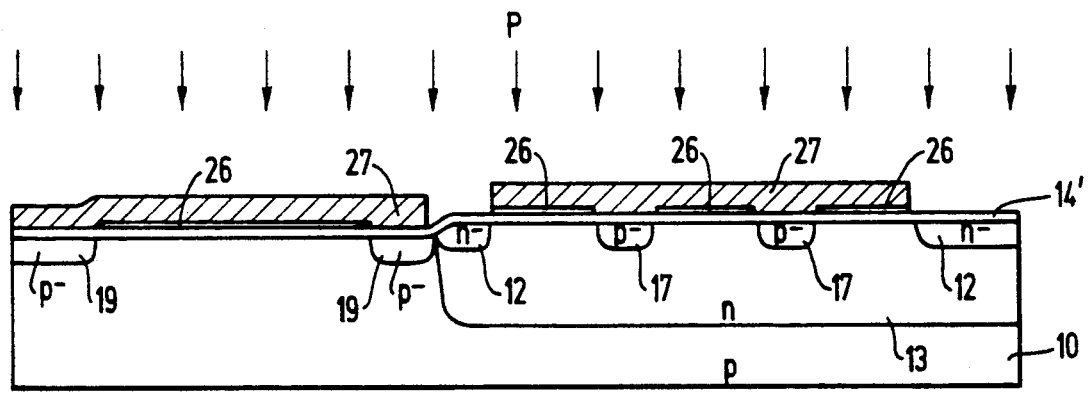

(d) As shown in FIG. 3(d), additional resist 27 is applied and then subjected to photoetching to provide openings therein at regions where n-type stoppers are to be formed. Thereafter, ion implantation of P is effected under the conditions of 80 keV and a concentration of $2 \times 10^{13} cm^{-2}$ and, where resist 27 has been removed, a heat treatment is carried out to form n⁻-type channel stopper regions 12. Then, the remaining resist 27 is removed.

Figure 3E:
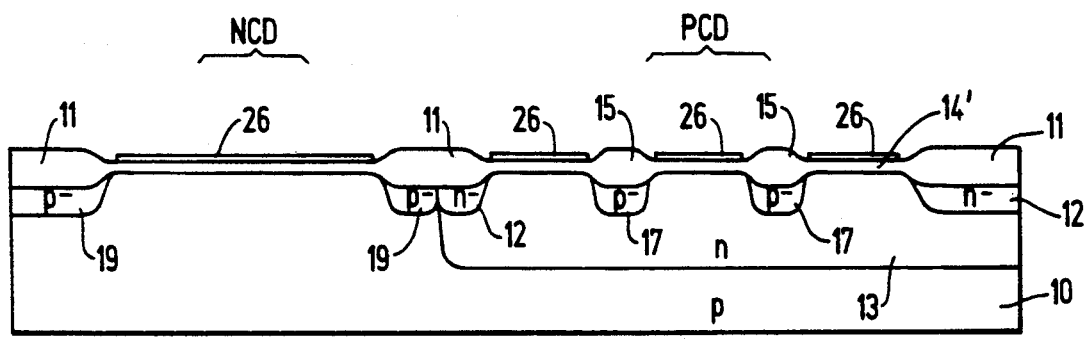

(e) With the silicon nitride film sections 26 used as masks, local field oxidation is effected by a wet oxidation process carried out at 950° C. to form LOCOS oxide films 11 and 15 having a thickness of about 9000Å, as shown in FIG. 3(e). The oxide films 11 are LOCOS oxide films for element isolation, while the oxide films 15 are high breakdown voltage LOCOS oxide films for gate electrodes (not shown in FIG. 3(e)). Subsequently, the silicon nitride film sections 26 and the silicon oxide film 14' are successively removed and then dry oxidation is carried out at 1100° C. to form a new gate oxide film 14" having a thickness of about 600Å. Then, a resist is coated and subjected to photoetching to provide openings therein at NCD (n-channel doped) regions and then ion implantation of P is carried out under the conditions of 100 keV and a concentration of $4 \times 10^{11} cm^{-2}$. Subsequently, a resist is coated and subjected to photoetching to provide openings therein at PCD (p-channel doped) regions and then ion implantation of B is carried out under the conditions of 40 keV and $5 \times 10^{11} cm^{-2}$. Thus, basic regions of a depletion type MOS are formed (the illustration of these regions being omitted).

Figure 3F:
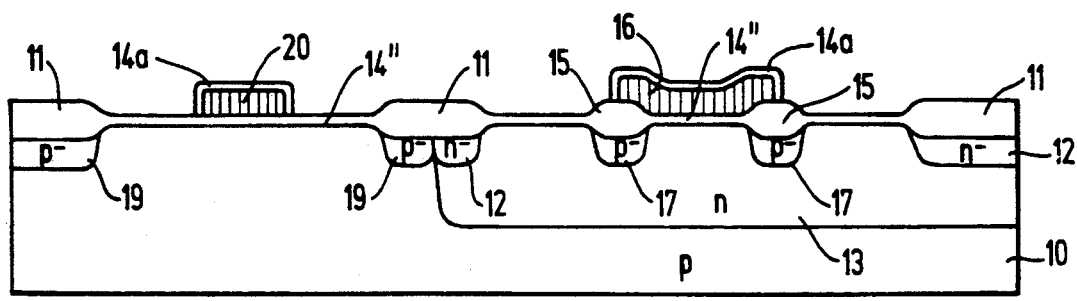

(f) A polycrystalline silicon layer having a thickness of about 4000Å is formed on the whole surface and, after P or As (arsenic) has been diffused therein so that an n⁺-type polycrystalline silicon layer is formed, it is subjected to photoetching using a resist (not shown) to form gate electrodes 16 and 20 of polycrystalline silicon, as shown in FIG. 3(f). Subsequently, light oxide films 14a are formed so as to cover the gate electrodes 16 and 20, respectively, by wet oxidation carried out at 830° C.

Figure 3G:
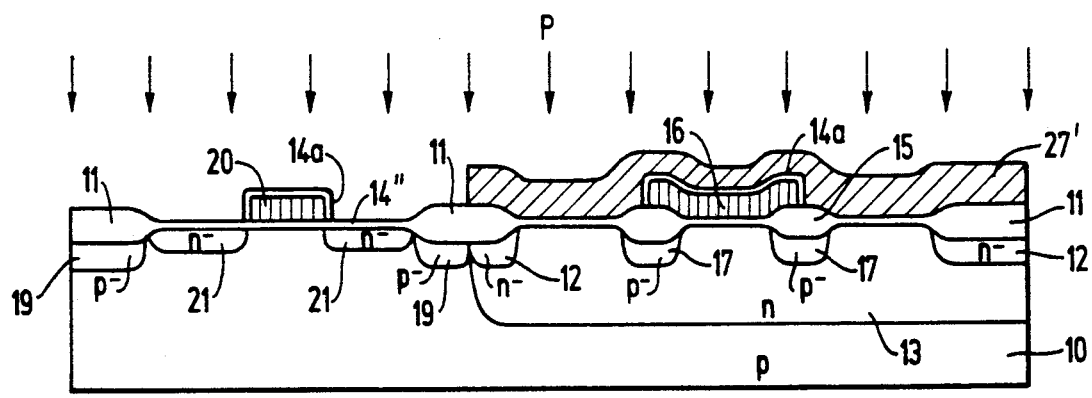

(g) As shown in FIG. 3(g), a resist 27' is applied and provided with openings by photoetching and, with the gate electrode 20 used as a mask, P ions are implanted into an n-channel MOS transistor forming region under the conditions of 80 keV and a concentration of $5 \times 10^{12} cm^{-2}$ to form n⁻-type diffused layers 21. Thus, foundations for offset regions are formed.

Figure 3H:
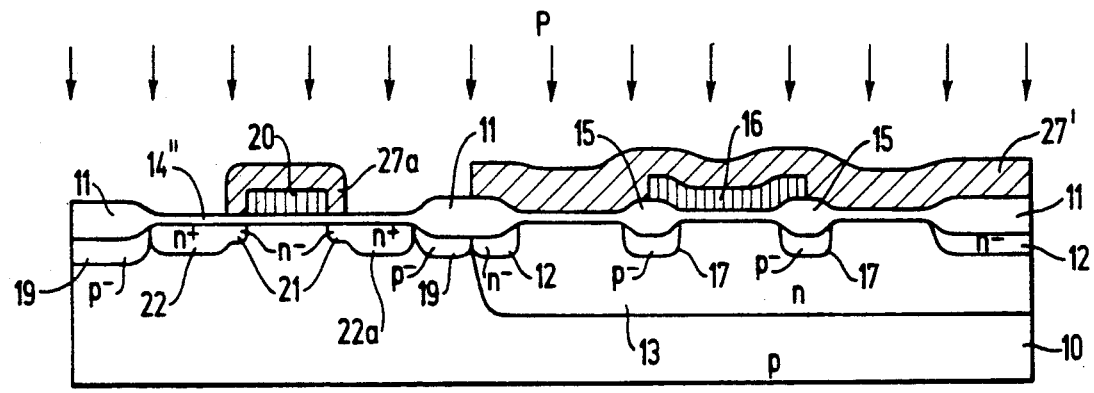

(h) As shown in FIG. 3(h), a resist 27a that covers the gate electrode 20 is formed by photoetching and, with this resist 27a used as a mask, ion implantation of P is carried out under the conditions of 80 keV and a concentration of $4 \times 10^{15} cm^{-2}$. After the resists 27' and 27a have been removed, a heat treatment is carried out to form n⁺-type diffused layers 22 and 22a which serve as source and drain regions. Upon completion of this step, a high breakdown voltage masked offset type MOS transistor having an n-channel LDD structure is formed.

Although in this embodiment, the n⁻-type diffused layers 21 which are defined as offset regions are masked with the resist 27a, it is also possible to employ as masks sidewall insulating films provided on the side walls, respectively, of the gate electrode, which are used in the process for forming a transistor having the LDD structure.

Figure 3I:
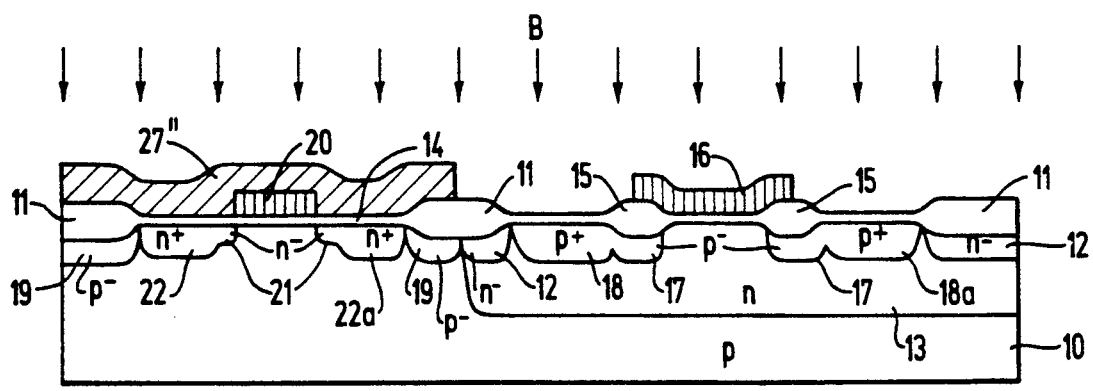

(i) As shown in FIG. 3(i), a resist 27" is coated only on the n-channel MOS transistor formed as described, aided by photoetching. Then, B ions are implanted under the conditions of 35 keV and a concentration of $2 \times 10^{15} cm^{-2}$, using the gate electrode 16 and the LOCOS oxide films 11 and 15 in the p-channel MOS transistor forming region as masks. After the resist 27" has been removed, a heat treatment is carried out to form $p^+$-type diffused layers 18 and 18a which serve as source and drain regions. Upon completion of this step, a high breakdown voltage MOS transistor having a p-channel LOCOS offset structure is formed.

Figure 3J:
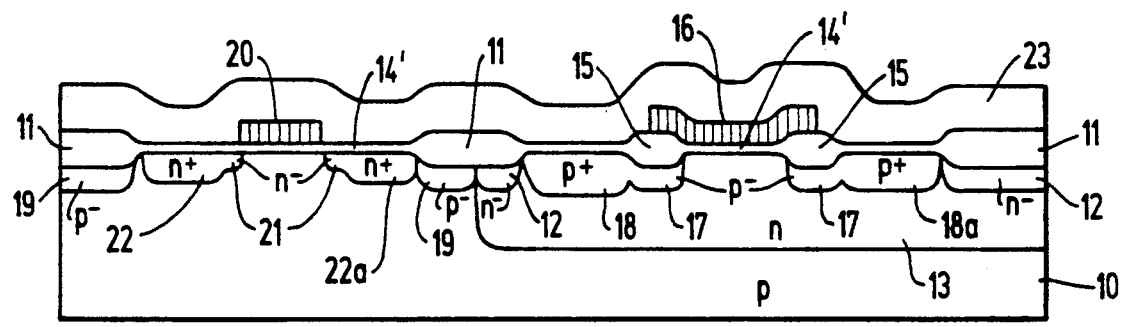
Figure 3K:
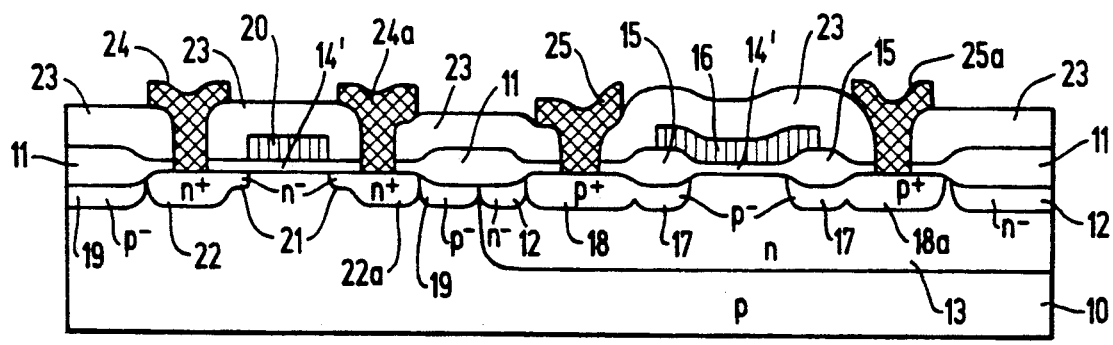

(j) As shown in FIG. 3(j), a PSG film for a second field region, which serves as an interlayer insulating film 23, is deposited on the whole surface. The PSG film may be a BPSG film or may be replaced with a silicon oxide film.

(k) Thereafter, the interlayer insulating film 23 is provided with contact holes, by photoetching according to the conventional method, for leading out source and drain regions. Then, an Al film for electrode interconnections is deposited and patterned by photoetching, thereby forming Al interconnection films 24, 24a, 25 and 25a and thus completing high breakdown voltage CMOS transistors similar to those of the first embodiment shown in FIG. 1.

It should be noted that, although in the embodiments respectively shown in FIG. 1 and FIGS. 3(a) to 3(k) a masked offset type transistor is formed as being an n-channel transistor on a p-type semiconductor substrate and a LOCOS offset type transistor is formed as being a p-channel transistor in an n-well region, the arrangement of the CMOS may also be such that an n-channel transistor is formed in a p-well region provided in an n-type semiconductor substrate and a p-channel transistor is formed on the n-type semiconductor substrate.

However, if the p-channel transistor is also formed with the masked offset structure, masks will be needed in the steps shown in FIGS. 3(g) and 3(h). Therefore, it is preferable that the p-channel transistor have the LOCOS offset structure. Conversely, if the n-channel transistor is formed with the LOCOS offset structure, the step shown in FIG. 3(h) is not needed, advantageously. However, since the size of each transistor having the LOCOS offset structure is relatively quite large, if the LOCOS offset structure is employed for elements that need a relatively large number of transistors, such as memory cells, the area occupied by these transistors is increased, so that it is impossible to increase the integration density. Therefore, the above-described arrangement is unsuitable for miniaturization. In view of these factors, the arrangement according to the embodiments shown in FIG. 1 and FIGS. 3(a) to 3(k) may be most suitable for application to EEPROM under the existing circumstances.

More specifically, the most suitable structure for EEPROM is one in which n-channel transistors which are required in a relatively large number to constitute memory cells and a part of a peripheral circuit are formed so as to have the masked offset structure, while p-channel transistors which are required in a relatively small number to constitute a part of the peripheral circuit are formed so as to have the LOCOS offset structure. However, when p-channel transistors are required in a larger number than n-channel transistors, it is preferable that n-channel transistors have the LOCOS offset structure, while p-channel transistors have the masked offset structure, in reverse to the above.

As has been described above, the present invention provides a semiconductor memory having a peripheral circuit constituted by CMOS, wherein, for example, n-channel high breakdown voltage transistors which are required in a relatively large number are formed with the masked offset structure, while, for example, p-channel high breakdown voltage transistors which are required in a relatively small number are formed with the LOCOS offset structure, these two different types of transistors being fabricated on the same substrate, and also provides a method of manufacturing the above-described semiconductor device.

Thus, according to the present invention, high breakdown voltage transistors which are employed in a relatively large number and therefore greatly affect the integration density are formed with the masked offset structure that is advantageous from the viewpoint of integration density, while high breakdown voltage transistors which are not required in a large number and therefore have less effect on the integration density are formed with the LOCOS offset structure that needs a relatively small number of manufacturing steps and hence involves a relatively low production cost, and these two different types of transistors are fabricated on the same substrate.

Therefore, it is possible to achieve optimization of both the arrangement of a semiconductor device and the method of manufacturing the same in regard to miniaturization, reduction in the number of masks required and simplification of the manufacturing process. In addition, utilization of the device structure and manufacturing method according to the present invention will greatly contribute to achievement of miniaturization and other requirements such as those described above also in formation, for example, of an EEPROM wherein gates are formed from a single layer of polycrystalline silicon.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. In a semiconductor device comprising a substrate having a memory cell region and a peripheral circuit region, the memory cell region being composed of a plurality of memory transistors each defined by a first high breakdown voltage transistor of a first conductivity type and a plurality of select transistors each defined by a second high breakdown voltage transistor of the first conductivity type, and the peripheral circuit region having a part which is constituted by a third high breakdown voltage transistor of a second conductivity type, the improvement wherein: said first and second high breakdown voltage transistors each include a first gate electrode having an end, and a first offset region defined by a low concentration impurity region having a substantially flat surface which is formed in a region of said substrate which is below and adjacent to said end of said first gate electrode; and said third high breakdown voltage transistor has a second gate electrode, a thick insulating film provided at one side of said second gate electrode, with at least a part of said film being buried in said substrate, and a second offset region defined by a low concentration impurity region provided in a region of said substrate which is under said thick insulating film.

2. A semiconductor device according to claim 1, wherein both said first and second high breakdown voltage transistors are n-channel type high breakdown voltage transistors, while said third high breakdown voltage transistor is a p-channel type high breakdown voltage transistor.

3. A semiconductor device according to claim 1, wherein each said first offset region is an n-type impurity region, and said second offset region is a p-type impurity region.

4. A device according to claim 1 wherein each said offset region constitutes at least part of a source or drain region of its respective transistor.

5. In a complementary semiconductor device comprising a substrate having a plurality of high breakdown voltage transistors of a first conductivity type and at least one high breakdown voltage transistor of a second conductivity type opposite to the first conductivity type, the improvement wherein: the number of transistors of the first conductivity type is greater than the number of transistors of the second conductivity type; each said transistor of the first conductivity type is a masked offset type transistor; and each said transistor of the second conductivity type is a LOCOS offset type transistor.

6. A device according to claim 5 wherein each said transistor of the first conductivity type is an n-channel transistor and each said transistor of the second conductivity type is a p-channel transistor.

7. A device according to claim 1 wherein each of said first and second transistors is a masked offset type transistor and said third transistor is a LOCOS offset type transistor.

8. A semiconductor device according to claim 7 wherein both said first and second high breakdown voltage transistors are n-channel type high breakdown voltage transistors, while said third high breakdown voltage transistor is a p-channel type high breakdown voltage transistor.

9. A semiconductor device according to claim 7, wherein each said first offset region is an n-type impurity region, and said second offset region is a p-type impurity region.

* * * * *